United States Patent
Li et al.

(10) Patent No.: US 10,398,022 B1
(45) Date of Patent: Aug. 27, 2019

(54) ADJUSTABLE FIXING DEVICE FOR A HEAT DISSIPATING COMPONENT AND RELATED ELECTRONIC APPARATUS

(71) Applicant: Wiwynn Corporation, New Taipei (TW)

(72) Inventors: Tsung-Han Li, New Taipei (TW); Tzu-Ting Wang, New Taipei (TW); Ting-Yu Pai, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 0 days.

(21) Appl. No.: 16/271,874

(22) Filed: Feb. 10, 2019

(30) Foreign Application Priority Data

Nov. 23, 2018 (TW) .............................. 107141811 A

(51) Int. Cl.
    *H05K 1/02* (2006.01)
    *H01L 23/40* (2006.01)
(52) U.S. Cl.
    CPC ....... *H05K 1/0209* (2013.01); *H01L 23/4006* (2013.01); *H01L 2023/4087* (2013.01)

(58) Field of Classification Search
CPC .. H05K 1/0201; H05K 1/0203; H05K 1/0204; H05K 1/0206; H05K 1/0207; H05K 1/021
See application file for complete search history.

(56) References Cited

FOREIGN PATENT DOCUMENTS

| TW | M262970 | 4/2005 |
|---|---|---|
| TW | I308955 | 4/2009 |

*Primary Examiner* — Jeremy C Norris
(74) *Attorney, Agent, or Firm* — Winston Hsu

(57) ABSTRACT

An adjustable fixing device applied to a heat dissipating component is used in an electronic apparatus. The adjustable fixing device includes a first connecting component, a second connecting component and a fixing component. The first connecting component has a first stopper portion. The second connecting component has a first screwing portion and is detachably connected to the first connecting component. The fixing component includes a main body, a second stopper portion and a second screwing portion. The main body has a first part and a second part. The second stopper portion is disposed on the first part to move relative to the first stopper portion according to rotation of the main body. The second screwing portion is disposed on the second part and used to engage with the first screwing portion.

20 Claims, 10 Drawing Sheets

ADJUSTABLE FIXING DEVICE FOR A HEAT DISSIPATING COMPONENT AND RELATED ELECTRONIC APPARATUS

BACKGROUND OF THE INVENTION

1. Field of the Invention

The present invention relates to an adjustable fixing device applied to a heat dissipating component and a related electronic apparatus, and more particularly, to an adjustable fixing device with a simple structure applied to a heat dissipating component and a related electronic apparatus.

2. Description of the Prior Art

A conventional heat dissipating component fixing device includes a supporter disposed on a main board. A fixing component (such as a screw or a bolt) passes through the heat dissipating component and is locked into the supporter on the main board, therefore the heat dissipating component can be assembled with a heat generating component of the main board. For example, the heat generating component can be a central processing unit, and the heat dissipating component is fixed on the main board by contacting an upper surface of the central processing unit. The conventional fixing device is applied to the heat dissipating component with a stage-shaped bottom. A bridging component can be disposed on a part of the stage-shaped bottom. An end of the fixing component passes through a compression spring and an opening on the bridging component, and a buckling ring is engaged with the end of the fixing component, thus the fixing component can be locked into the main board to contact the stage-shaped bottom of the heat dissipating component against the heat generating component of the main board. The conventional fixing device has drawbacks of complicated structures and an inconvenient assembly due to lots of components. The fixing component and the compression spring are separated units, so that an assembly of fixing component and the compression spring is difficult to have preferred yield rate. Therefore, design of a heat dissipating component fixing device having simple structures and easy operation is an important issue in the related mechanical design industry.

SUMMARY OF THE INVENTION

The present invention provides an adjustable fixing device with a simple structure applied to a heat dissipating component and a related electronic apparatus for solving above drawbacks.

According to the claimed invention, an adjustable fixing device applied to a heat dissipating component is disclosed. The adjustable fixing device includes a first connecting component, a second connecting component and a fixing component. The first connecting component has a first stopper portion. The second connecting component is detachably connected to the first connecting component and has a first screwing portion. The fixing component has a main body, a second stopper portion and a second screwing portion. The main body includes a first part and a second part. The second stopper portion is disposed on the first part to move relative to the first stopper portion according to rotation of the main body, and the second screwing portion is disposed on the second part and configured to engage with the first screwing portion.

According to the claimed invention, an electronic apparatus includes a circuit board, a heat dissipating component and an adjustable fixing device. The adjustable fixing device is configured to fix the heat dissipating component on the circuit board. The adjustable fixing device includes a first connecting component, a second connecting component and a fixing component. The first connecting component is disposed on the heat dissipating component and has a first stopper portion. The second connecting component is disposed on the circuit board and detachably connected to the first connecting component and has a first screwing portion. The fixing component has a main body, a second stopper portion and a second screwing portion. The main body includes a first part and a second part. The second stopper portion is disposed on the first part to move relative to the first stopper portion according to rotation of the main body, and the second screwing portion is disposed on the second part and configured to engage with the first screwing portion.

The adjustable fixing device and the related electronic apparatus of the present invention can dispose the first stopper portion on the first connecting component (such as a specific nut) of the heat dissipating component, and can dispose the first screwing portion on the second connecting component (such as a screw fixer) of the circuit board, and further can dispose the second stopper portion and the second screwing portion on the fixing component. The second stopper portion and the second screwing portion can be respectively disposed on the first part and the second part of the fixing component with different radial dimensions. The second stopper portion can pass through the first stopper portion, and the fixing component cannot be separated from the first connecting component via an assembly constraint of the first stopper portion and the second stopper portion. The second screwing portion can be locked with the first screwing portion to stably assemble the heat dissipating component with the circuit board. The second stopper portion can be the external thread portion or the slide block, and accordingly the first stopper portion can be the internal thread portion or the opening.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
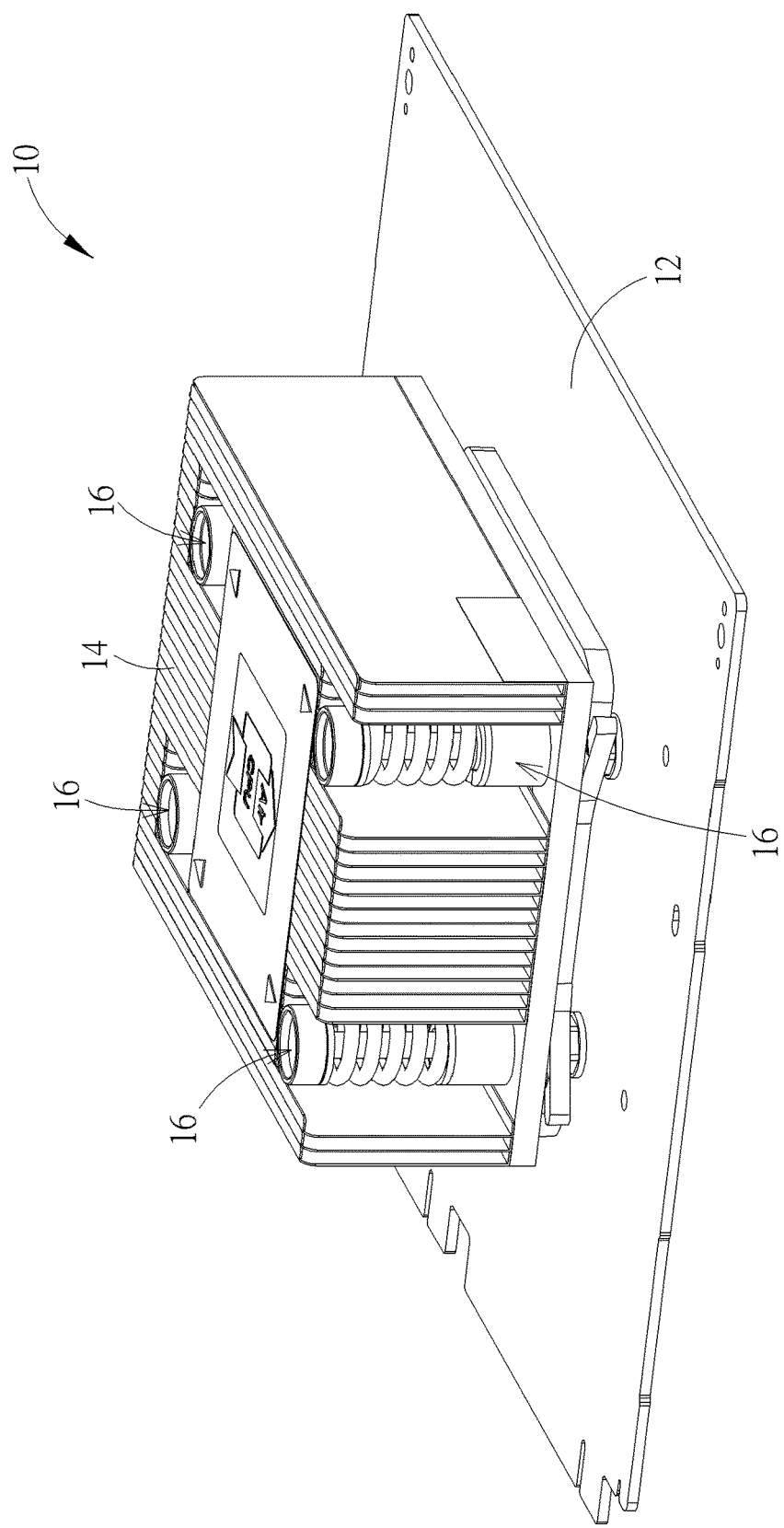
FIG. 1 is an assembly diagram of an electronic apparatus according to an embodiment of the present invention.
Figure 2:
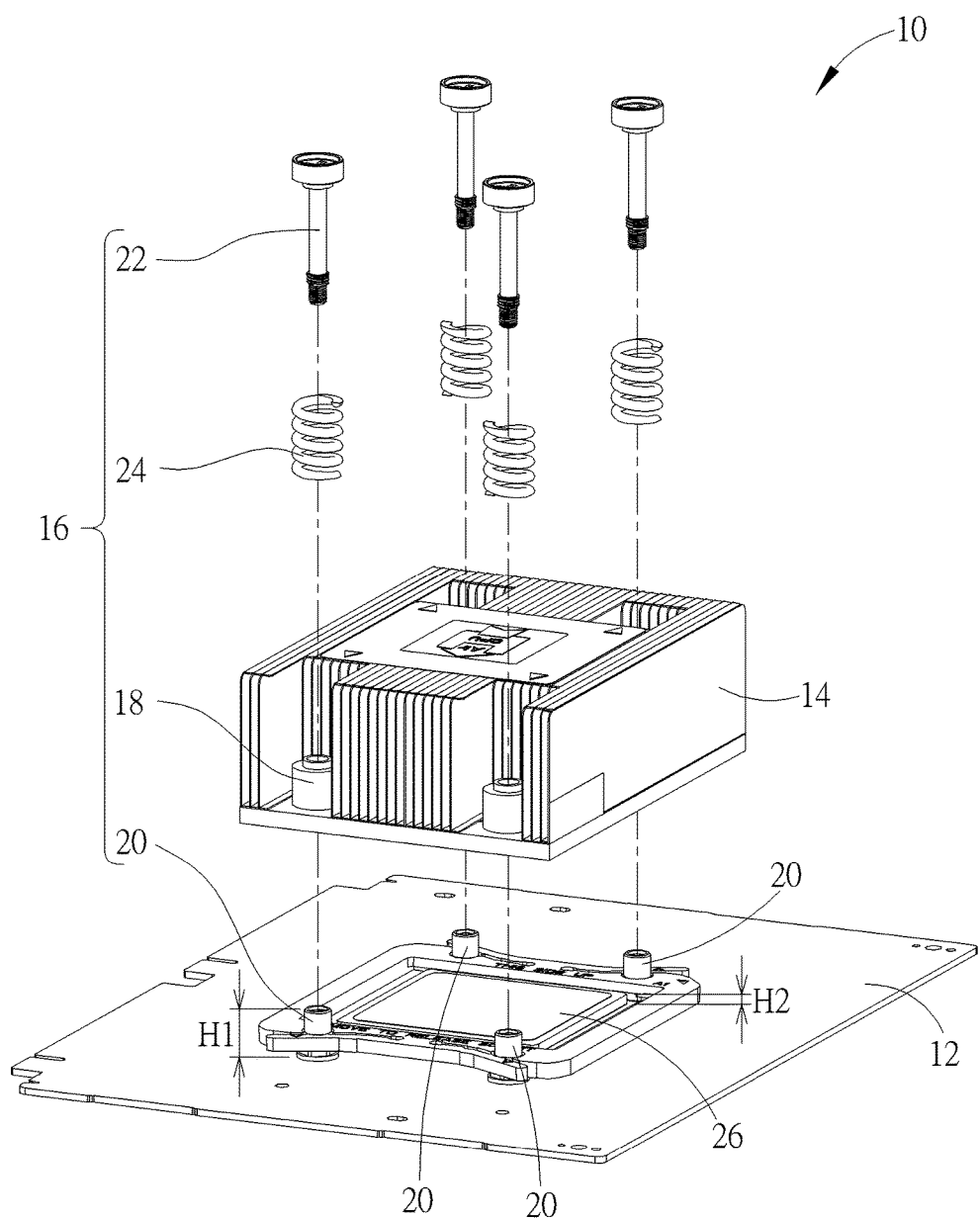
FIG. 2 is an exploded diagram of the electronic apparatus according to the embodiment of the present invention.

Please refer to FIG. 1 and FIG. 2. FIG. 1 is an assembly diagram of an electronic apparatus 10 according to an embodiment of the present invention. FIG. 2 is an exploded diagram of the electronic apparatus according to the embodiment of the present invention. The electronic apparatus 10 can include a circuit board 12, a heat dissipating component 14 and an adjustable fixing device 16. The circuit board 12 can have a heat generating component 26. The heat dissipating component 14 can be disposed on the circuit board 12 via the adjustable fixing device 16, and contact against the heat generating component 26 to dissipate heat from the heat generating component 26. The adjustable fixing device 16 can include a first connecting component 18, a second connecting component 20, a fixing component 22 and a recovering component 24. The first connecting component 18 can be disposed on the heat dissipating component 14. The second connecting component 20 can be disposed on the circuit board 12. The fixing component 22 can insert into the recovering component 24 and pass through the first connecting component 18 and the second connecting component 20 for assembling the circuit board 12 with the heat dissipating component 14.

In the embodiment, a height H1 of the second connecting component 20 can be preferably greater than, but not limited to, a height H2 of the heat generating component 26 of the circuit board 12. When the heat dissipating component 14 is assembled with the circuit board 12, the second connecting component 20 can partly insert into the first connecting component 18, so that a bottom of the heat dissipating component 14 can contact against the heat generating component 26. The fixing component 22 can pass through the first connecting component 18 in a thread engaging manner to lock into the second connecting component 20. An engaging depth of the fixing component 22 relative to the second connecting component 20 can be varied to adjust deformation of the recovering component 24, so as to apply a downward pressure force to the heat generating component 26 via compressive deformation of the recovering component 24.

Figure 3:
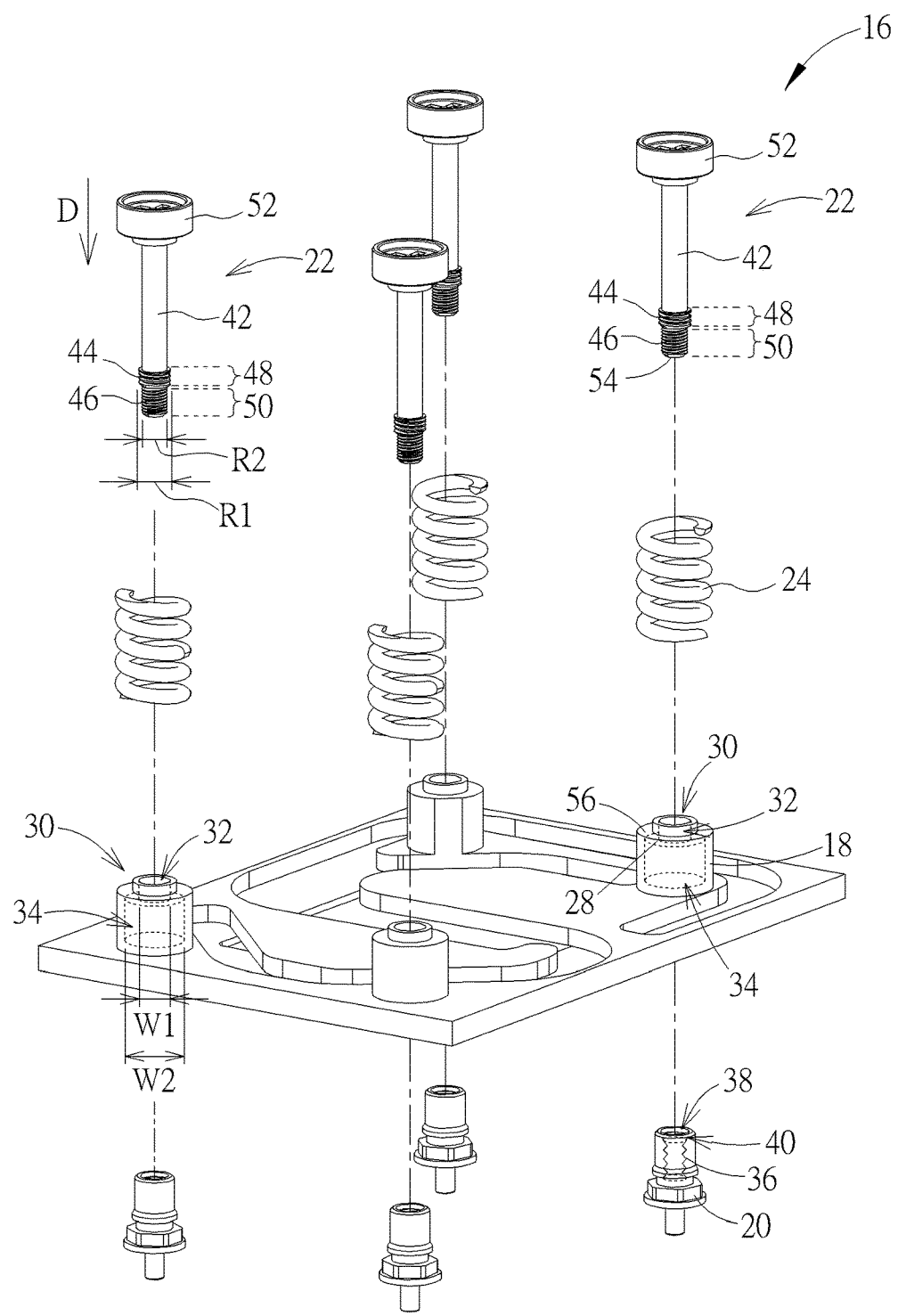
FIG. 3 is an exploded diagram of an adjustable fixing device according to a first embodiment of the present invention.
Figure 4:
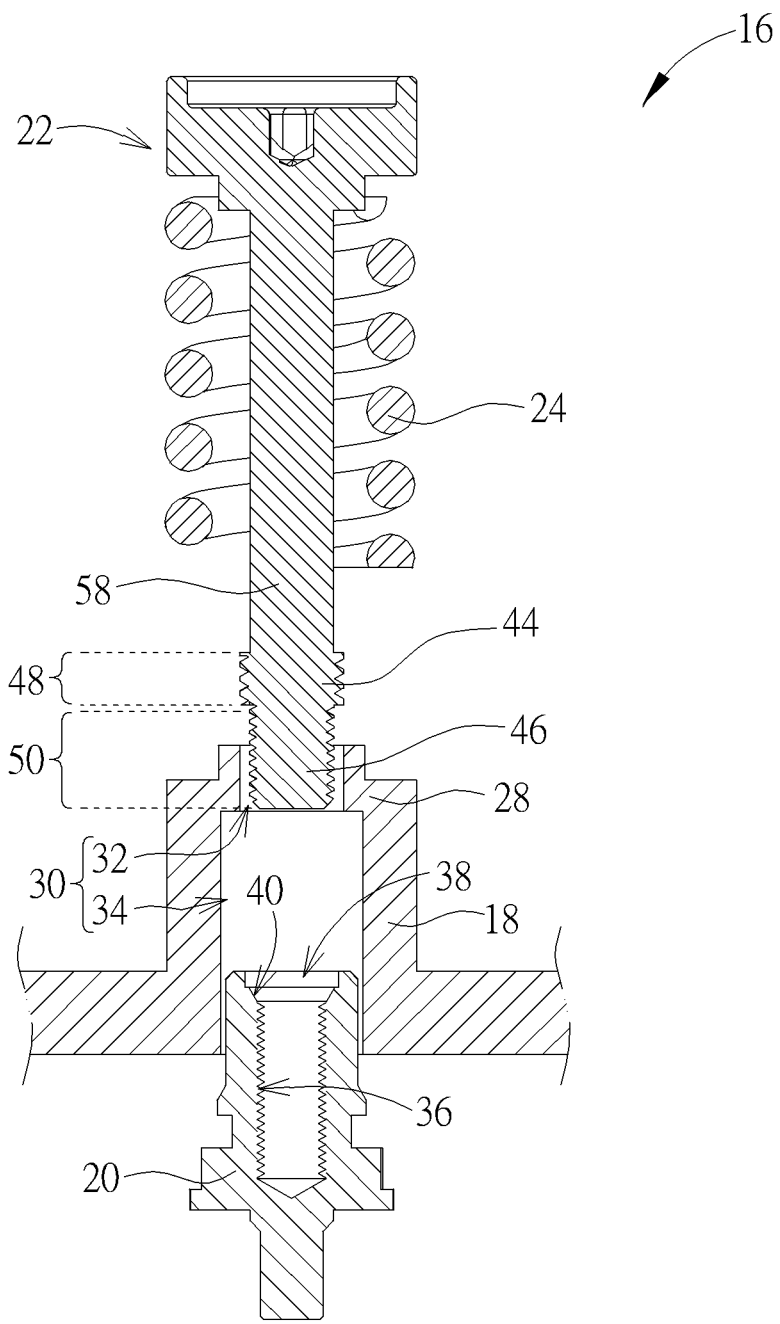
FIG. 4 to FIG. 6 are diagrams of the adjustable fixing device in different operation modes according to the first embodiment of the present invention.
Figure 5:
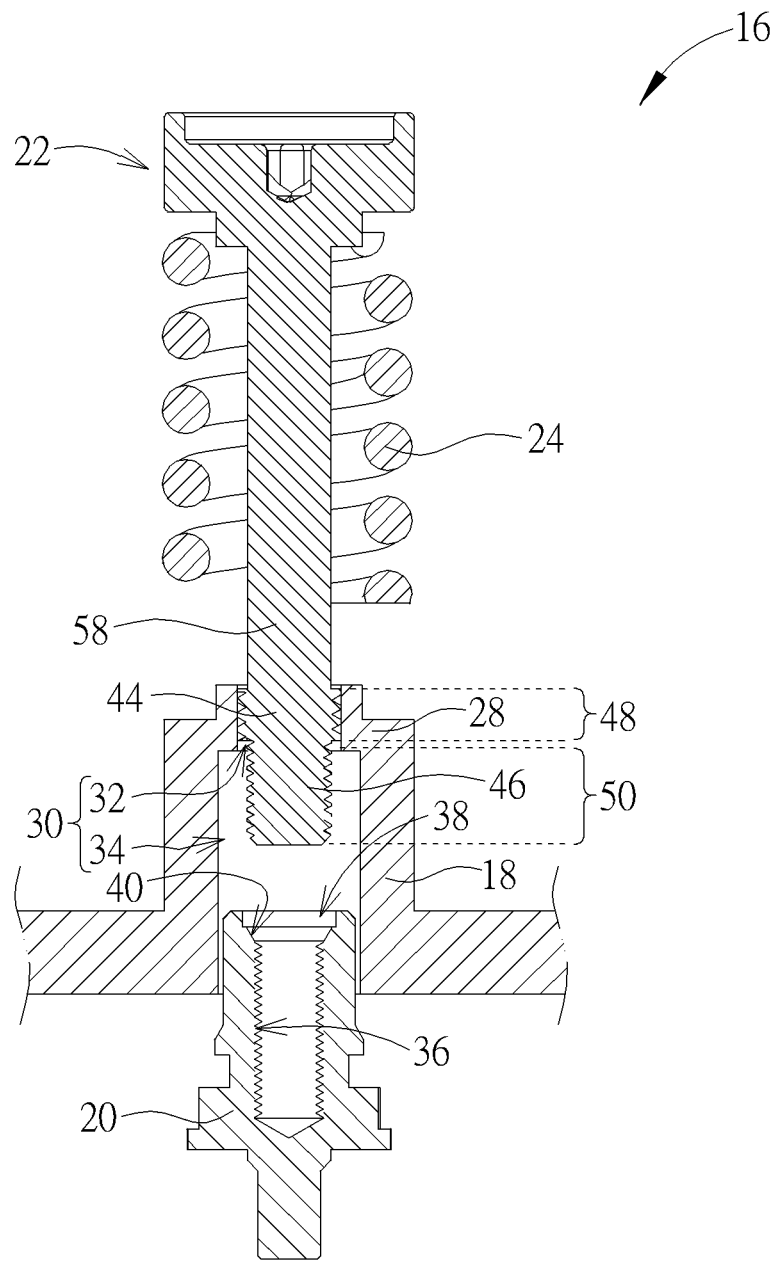
Figure 6:
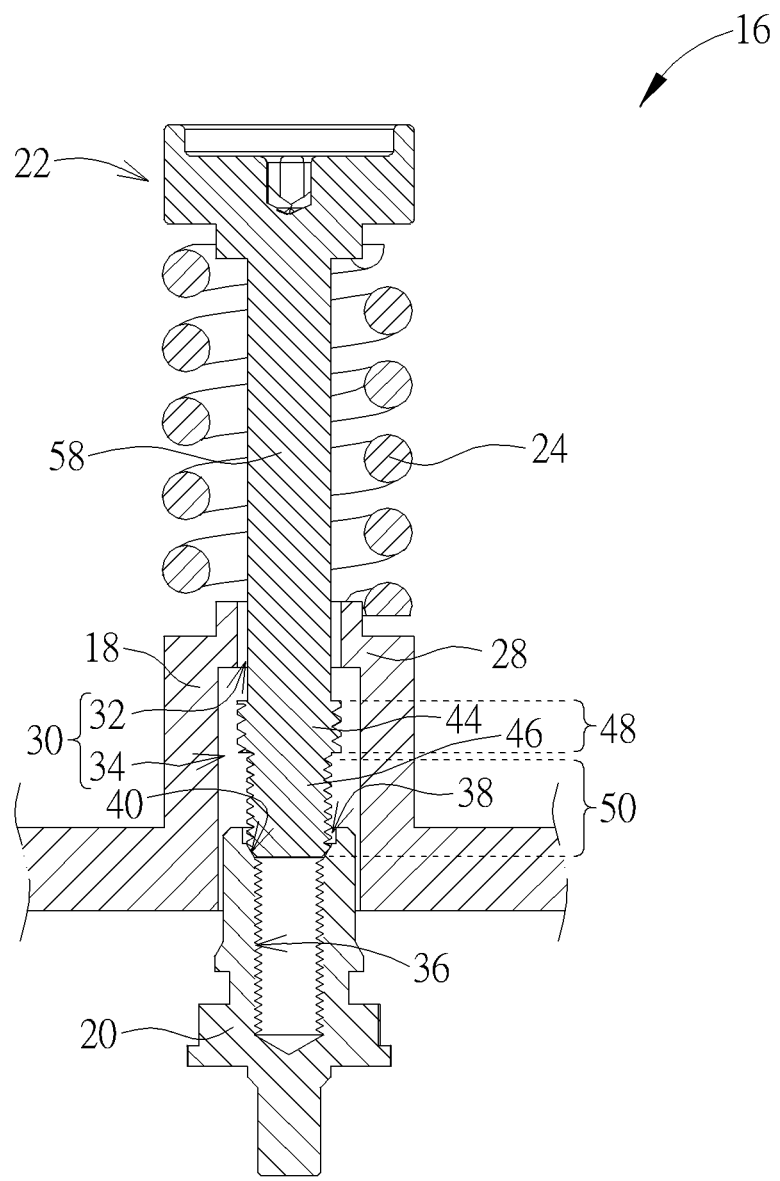

Please refer to FIG. 1 to FIG. 6. FIG. 3 is an exploded diagram of the adjustable fixing device 16 according to a first embodiment of the present invention. FIG. 4 to FIG. 6 are diagrams of the adjustable fixing device 16 in different operation modes according to the first embodiment of the present invention. The first connecting component 18 can have a first stopper portion 28, and a structure surrounded by the first stopper portion 28 can be a piercing hole structure 30 of the first connecting component 18. The piercing hole structure 30 can include a first chamber 32 and a second chamber 34 with different widths. The first stopper portion 28 can be disposed on the first chamber 32. The second chamber 34 can be configured to accommodate a part of the second connecting component 20. A width W1 of the first chamber 32 can be smaller than a width W2 of the second chamber 34. The second connecting component 20 can have a first screwing portion 36 disposed on an inner surface of the passing hole structure 38 on the second connecting component 20. An inlet end of the passing hole structure 38 can be designed as an inclined guiding surface structure 40 configured to move the fixing component 22 into the second connecting component 20. The second connecting component 20 can be connected to the first connecting component 18 in a detachable manner, which means the second connecting component 20 and the first connecting component 18 are not assembled with each other in a structural engaging manner when the second connecting component 20 inserts into the first connecting component 18.

The fixing component 22 can include a main body 42, a second stopper portion 44 and a second screwing portion 46.

The main body 42 can include a first part 48 and a second part 50 with different radial dimensions. A radial dimension R1 of the first part 48 can be greater than a radial dimension R2 of the second part 50, which means the first part 48 is wider than the second part 50. In addition, the radial dimension R1 may be equal to the width W1 of the first chamber 32, and the radial dimension R2 can be smaller than the width W1. The second stopper portion 44 can be disposed on the first part 48, and the second screwing portion 46 can be disposed on the second part 50, therefore the second stopper portion 44 and the second screwing portion 46 can be disposed on the main body 42 in a direction from a top portion 52 to a bottom portion 54 of the main body 42. Generally, the recovering component 24 can be a compression spring disposed on the main body 42 and located between the fixing component 22 and the first connecting component 18. Two ends of the recovering component 24 can respectively contact against the top portion 52 of the fixing component 22 and the upper edge 56 of the first connecting component 18.

In the first embodiment, the first stopper portion 28 and the second stopper portion 44 respectively can be an internal thread portion and an external thread portion. As shown in FIG. 4, the fixing component 22 is prepared to insert into the first connecting component 18, and the second screwing portion 46 is not engaged with the first stopper portion 28 because the radial dimension R2 is smaller than the width W1. As shown in FIG. 5, when the fixing component 22 is moved into the first connecting component 18, the second stopper portion 44 can be engaged with and moved relative to the first stopper portion 28 for locking in accordance with rotation of the main body 42; in the meantime, the second screwing portion 46 can be spaced from the first screwing portion 36. As shown in FIG. 6, when the second stopper portion 44 passes through the first stopper portion 28 to move from the first chamber 32 into the second chamber 34, the inclined guiding surface structure 40 can guide the second screwing portion 46 into the passing hole structure 38, and second screwing portion 46 can be engaged with the first screwing portion 36 for locking; meanwhile, a first non-screw part 58 of the main body 42 is located within the first stopper portion 28, and the second stopper portion 44 is located under the first stopper portion 28, which means the first stopper portion 28 can stop motion of the second stopper portion 44 for prevent the fixing component 22 from being separated from the first connecting component 18. The first non-screw part 58 can be disposed above the first part 48, such as one side of the first part 48 opposite to the second part 50. A compressive deformation quantity of the recovering component 24 can be enlarged due to increase of the engaging depth between the second screwing portion 46 and the first screwing portion 36, so as to modulate the downward pressure force generated by the recovering component 24.

Figure 7:
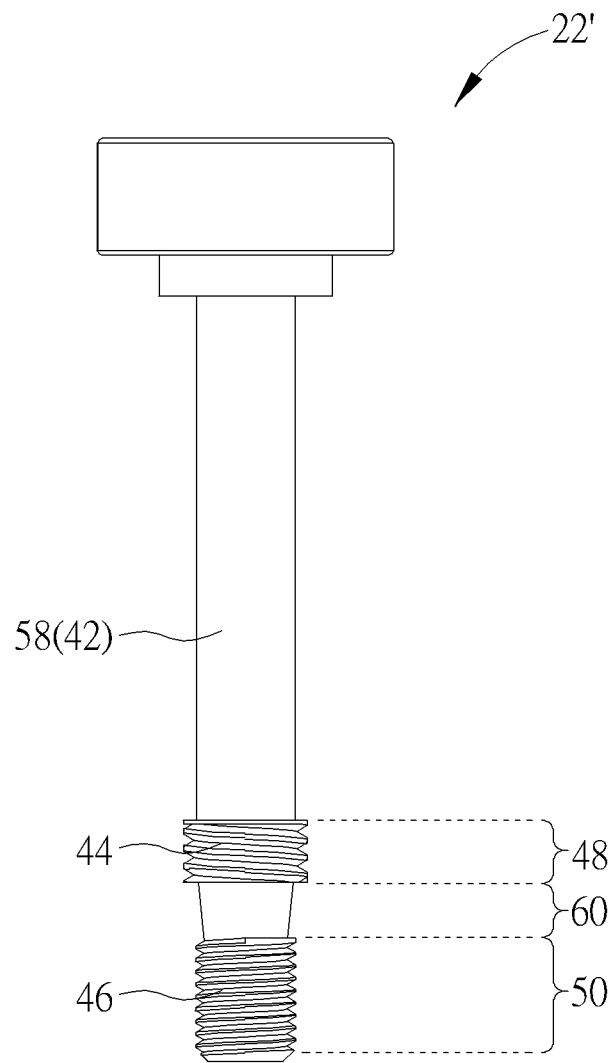
FIG. 7 is a diagram of a fixing component according to another embodiment of the present invention.

Please refer to FIG. 7. FIG. 7 is a diagram of the fixing component 22' according to another embodiment of the present invention. In this embodiment, elements having the same numerals as one of the above-mentioned embodiment have the same structures and functions, and a detailed description is omitted herein for simply. The fixing component 22' can include a second non-screw part 60 disposed between the first part 48 and the second part 50 of the main body 42. The radial dimension of the first non-screw part 58 may equal the radial dimension of the main body 42. The second non-screw part 60 can be connected to the second stopper portion 44 and the second screwing portion 46, therefore the radial dimension of the second non-screw part 60 can be gradually decreased from the first part 48 to the second part 50. When the fixing component 22 is assembled with the second connecting component 20, the second non-screw part 60 can contact against the inclined guiding surface structure 40 to avoid the fixing component 22 from moving downwardly, so as to prevent the external thread portion of the second stopper portion 44 from damage.

Figure 8:
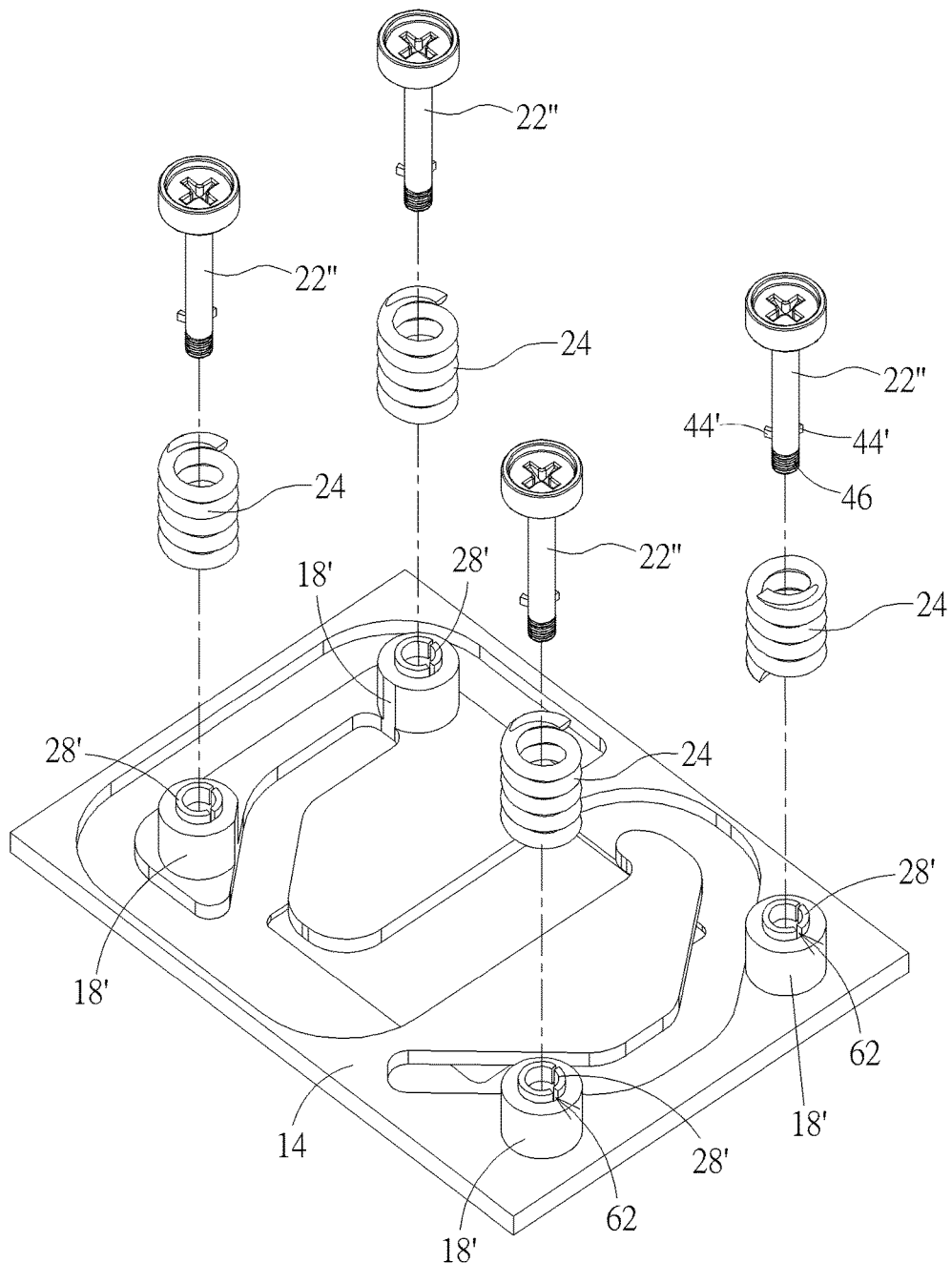
FIG. 8 is a partial exploded diagram of the adjustable fixing device according to a second embodiment of the present invention.
Figure 9:
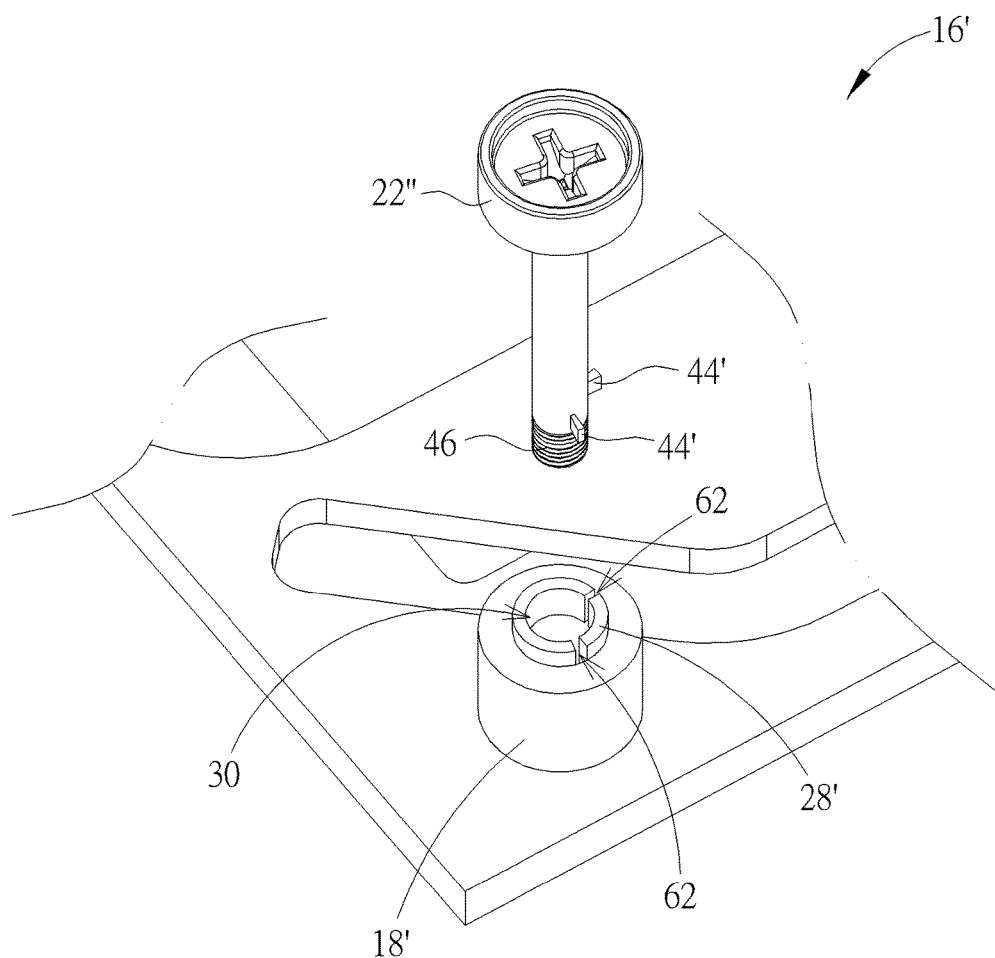
FIG. 9 and FIG. 10 are diagrams of the adjustable fixing device in different operation modes according to the second embodiment of the present invention.
Figure 10:
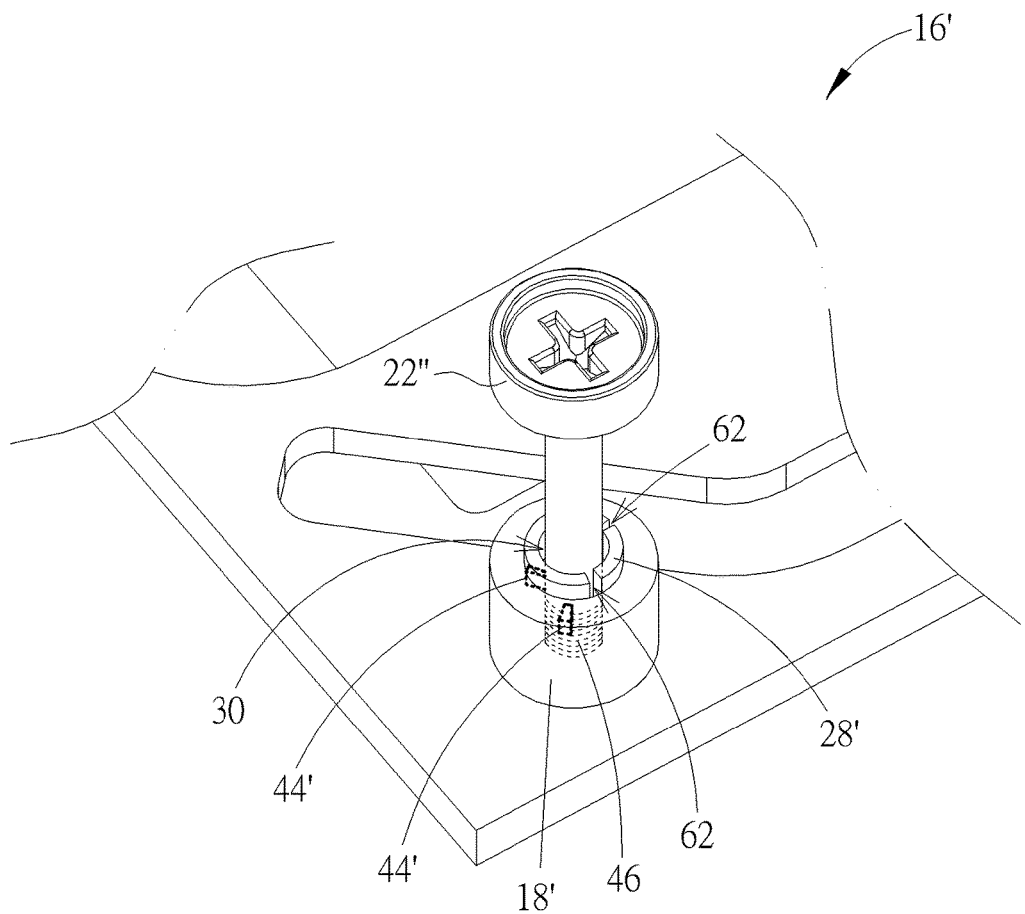

Please refer to FIG. 8 to FIG. 10. FIG. 8 is a partial exploded diagram of the adjustable fixing device 16' according to a second embodiment of the present invention. FIG. 9 and FIG. 10 are diagrams of the adjustable fixing device 16' in different operation modes according to the second embodiment of the present invention. In the second embodiment, elements having the same numerals as ones of the first embodiment have the same structures and functions, and a detailed description is omitted herein for simply. The fixing component 22" of the adjustable fixing device 16' can be assembled with the first connecting component 18' of the heat dissipating component 14 in a rotatable engaging manner. The first stopper portion 28' of the first connecting component 18' can be an arc structure with an opening 62. The second stopper portion 44' of the fixing component 22" can be a slide block. A dimension of the slide block may equal to a dimension of the opening 62. As shown in FIG. 9, for assembling the fixing component 22" with the first connecting component 18', the second stopper portion 44' can align with the opening 62 to insert the second screwing portion 46 of the fixing component 22" into the piercing hole structure 30 of the first connecting component 18'. As shown in FIG. 10, when the second stopper portion 44' passes through the opening 62, the fixing component 22" can be rotated to misalign the second stopper portion 44' and the opening 62. The second stopper portion 44' can be moved from an outer side to an inner side of the arc structure, therefore the second stopper portion 44' can be stopped by the non-opening area of the arc structure so that the fixing component 22" cannot be separated from the first connecting component 18'.

In conclusion, the adjustable fixing device and the related electronic apparatus of the present invention can dispose the first stopper portion on the first connecting component (such as a specific nut) of the heat dissipating component, and can dispose the first screwing portion on the second connecting component (such as a screw fixer) of the circuit board, and further can dispose the second stopper portion and the second screwing portion on the fixing component. The second stopper portion and the second screwing portion can be respectively disposed on the first part and the second part of the fixing component with different radial dimensions. The second stopper portion can pass through the first stopper portion, and the fixing component cannot be separated from the first connecting component via an assembly constraint of the first stopper portion and the second stopper portion. The second screwing portion can be locked with the first screwing portion to stably assemble the heat dissipating component with the circuit board. The second stopper portion can be the external thread portion or the slide block, and accordingly the first stopper portion can be the internal thread portion or the opening. In the present invention, the second connecting component can be higher than the heat generating component, and the heat dissipating component still can contact against the heat generating component for providing preferred heat dissipating efficiency. The recovering component can be constrained by assembly of the fixing component and the first connecting component, thus the present invention can provide preferred assembly and disassembly convenience when the electronic apparatus is transferred.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An adjustable fixing device applied to a heat dissipating component, comprising:
a first connecting component having a first stopper portion;
a second connecting component detachably connected to the first connecting component, the second connecting component having a first screwing portion; and
a fixing component, having a main body, a second stopper portion and a second screwing portion, the main body comprising a first part and a second part, the second stopper portion being disposed on the first part to move relative to the first stopper portion according to rotation of the main body, the second screwing portion being disposed on the second part and configured to engage with the first screwing portion.

2. The adjustable fixing device of claim 1, further comprising:
a recovering component disposed between the fixing component and the first connecting component, a compressive deformation quantity of the recovering component being varied related to an engaging depth between the first screwing portion and the second screwing portion.

3. The adjustable fixing device of claim 2, wherein the main body comprises a top portion and a bottom portion, two ends of the recovering component respectively contacts against the top portion and an upper edge of the first connecting component.

4. The adjustable fixing device of claim 3, wherein a radial dimension of the first part is greater than a radial dimension of the second part, and the second stopper portion and the second screwing portion are disposed on the main body in a direction from the top portion to the bottom portion.

5. The adjustable fixing device of claim 1, wherein the second screwing portion is separated from the first screwing portion when the second stopper portion is engaged with the first stopper portion, the second screwing portion is engaged with the first screwing portion when the second stopper portion passes through the first stopper portion.

6. The adjustable fixing device of claim 1, wherein the first connecting component further has a piercing hole structure, the piercing hole structure comprises a first chamber and a second chamber with different widths, the first stopper portion is disposed inside the first chamber and configured to stop the second stopper portion for preventing the fixing component being separated from the first connecting component, the second chamber is configured to accommodate a part of the second connecting component.

7. The adjustable fixing device of claim 1, wherein the second connecting component further has a passing hole structure, the first screwing portion is disposed on an inner surface of the passing hole structure, an inlet end of the passing hole structure is an inclined guiding surface structure configured to guide the second screwing portion to engage with the first screwing portion.

8. The adjustable fixing device of claim 1, wherein the main body further has a non-screw part disposed on a side of the first part opposite to the second part, the non-screw part is located within the first stopper portion, and the second stopper portion is under the first stopper portion when the second screwing portion is engaged with the first screwing portion.

9. The adjustable fixing device of claim 1, wherein the first stopper portion and the second stopper portion respectively are an internal thread portion and an external thread portion.

10. The adjustable fixing device of claim 1, wherein the first stopper portion is an arc structure with an opening, the second stopper portion is a slide block, and the slide block passes through the opening to move from a side of the arc structure to the other side of the arc structure.

11. An electronic apparatus, comprising:
a circuit board;
a heat dissipating component; and
an adjustable fixing device configured to fix the heat dissipating component on the circuit board, the adjustable fixing device comprising:
a first connecting component disposed on the heat dissipating component and having a first stopper portion;
a second connecting component disposed on the circuit board and detachably connected to the first connecting component, the second connecting component having a first screwing portion; and
a fixing component, having a main body, a second stopper portion and a second screwing portion, the main body comprising a first part and a second part, the second stopper portion being disposed on the first part to move relative to the first stopper portion according to rotation of the main body, the second screwing portion being disposed on the second part and configured to engage with the first screwing portion.

12. The electronic apparatus of claim 11, wherein the adjustable fixing device further comprises a recovering component disposed between the fixing component and the first connecting component, a compressive deformation quantity of the recovering component is varied related to an engaging depth between the first screwing portion and the second screwing portion.

13. The electronic apparatus of claim 12, wherein the main body comprises a top portion and a bottom portion, two ends of the recovering component respectively contacts against the top portion and an upper edge of the first connecting component.

14. The electronic apparatus of claim 13, wherein a radial dimension of the first part is greater than a radial dimension of the second part, and the second stopper portion and the second screwing portion are disposed on the main body in a direction from the top portion to the bottom portion.

15. The electronic apparatus of claim 11, wherein the second screwing portion is separated from the first screwing portion when the second stopper portion is engaged with the first stopper portion, the second screwing portion is engaged with the first screwing portion when the second stopper portion passes through the first stopper portion.

16. The electronic apparatus of claim 11, wherein the first connecting component further has a piercing hole structure, the piercing hole structure comprises a first chamber and a second chamber with different widths, the first stopper portion is disposed inside the first chamber and configured to stop the second stopper portion for preventing the fixing component being separated from the first connecting component, the second chamber is configured to accommodate a part of the second connecting component.

17. The electronic apparatus of claim 11, wherein the second connecting component further has a passing hole structure, the first screwing portion is disposed on an inner surface of the passing hole structure, an inlet end of the passing hole structure is an inclined guiding surface structure configured to guide the second screwing portion to engage with the first screwing portion.

18. The electronic apparatus of claim 11, wherein the main body further has a non-screw part disposed on a side of the first part opposite to the second part, the non-screw part is located within the first stopper portion, and the second stopper portion is under the first stopper portion when the second screwing portion is engaged with the first screwing portion.

19. The electronic apparatus of claim 11, wherein the first stopper portion and the second stopper portion respectively are an internal thread portion and an external thread portion.

20. The electronic apparatus of claim 11, wherein the first stopper portion is an arc structure with an opening, the second stopper portion is a slide block, and the slide block passes through the opening to move from a side of the arc structure to the other side of the arc structure.

* * * * *